United States Patent [19]

Roppongi et al.

[11] Patent Number: 4,649,409
[45] Date of Patent: Mar. 10, 1987

[54] PHOTOELECTRIC TRANSDUCER ELEMENT

[75] Inventors: Makoto Roppongi; Kazuaki Tsuji, both of Kitakyushu, Japan

[73] Assignee: Tokyo Shibaura Denki Kabushiki Kaisha, Kawasaki, Japan

[21] Appl. No.: 543,327

[22] Filed: Oct. 19, 1983

[30] Foreign Application Priority Data

Nov. 12, 1982 [JP] Japan ................... 57-198604

[51] Int. Cl.$^4$ ................. H01L 27/14; H01L 31/00
[52] U.S. Cl. ........................ 357/30; 357/16; 357/34
[58] Field of Search ............ 357/30, 34, 16, 52, 357/30 G, 30 I

[56] References Cited

FOREIGN PATENT DOCUMENTS 2656420  6/1978  Fed. Rep. of Germany ........ 357/34

OTHER PUBLICATIONS

Holmes et al., "Modified Bipolar Phototransistor", Jan. 27, 1972, *Electronics Letters*, vol. 8, No. 2, pp. 23-24.

*Primary Examiner*—James W. Davie
*Assistant Examiner*—Georgia Y. Epps
*Attorney, Agent, or Firm*—Finnegan, Henderson, Farabow, Garrett & Dunner

[57] ABSTRACT

A photoelectric transducer element is disclosed wherein a region having a conductivity type opposite to that of a light-receiving region is formed in a surface layer of the light-receiving region of a photoelectric transducer element having a p-n junction. The switching speed of the element can be improved without decreasing either the photosensitivity or dielectric withstand voltage.

5 Claims, 13 Drawing Figures

PHOTOELECTRIC TRANSDUCER ELEMENT

BACKGROUND OF THE INVENTION

The present invention relates to a photoelectric transducer element and, more particularly, to a photoelectric transducer element having a high switching speed.

A conventional photoelectric transducer element, a phototransistor, is illustrated in FIGS. 1 and 2 or FIGS. 3 and 4.

In the phototransistor shown in FIGS. 1 and 2, a p conductivity type diffusion region 2 is formed in an N conductivity type silicon substrate 1. An N conductivity type diffusion region 3 is formed in the P-type diffusion region 2. The P-type region 2 serves as a light-receiving region (i.e., as a base region), and the N-type region 3 serves as an emitter region.

In the phototransistor shown in FIGS. 3 and 4, a base region comprises two regions having different impurity concentrations and different depths. More specifically, the base region is constituted by a P-type peripheral region 2B and a P+-type region 2A formed continuously with respect to the peripheral region 2B. The P-type peripheral region 2B has an impurity concentration lower than that of the P+-type region 2A, but has a depth greater than that of the P+-type region 2A. An N conductivity type diffusion region 3, which serves as an emitter region in the same manner as in FIGS. 1 and 2, is formed in the P-type base region 2B. In the phototransistors shown in FIGS. 1 to 4, collector electrodes 5 are formed on the N-type silicon substrates 1, and base electrodes 6 are formed on the base regions, respectively. Emitter electrodes 7 are formed on the N-type emitter regions 3. Reference numeral 8 denotes an $SiO_2$ insulation film. Here, it should be noted that the insulation film 8 is omitted in FIGS. 1 and 3.

In the phototransistors shown in FIGS. 1 to 4, since the base regions serving as light-receiving regions are wide, the number of carriers generated upon the incidence of light onto the respective base regions is great. Therefore, these phototransistors have high light sensitivity.

However, when the base region area is increased, to increase the number of carriers generated upon light incidence onto the light-receiving region, it takes time to recombine the carriers after the incident light is cut off, so that the turn-off time is increased (i.e., the switching speed is decreased), resulting in inconvenience. For example, the phototransistors shown in FIGS. 1 and 4 have a minimum turn-off time of between 15 $\mu$s and 20 $\mu$s. To increase the switching speed, the base area is decreased, to decrease the resistivity of the silicon substrate, so that the turn-off time is shortened and, hence, the switching speed is increased. However, the photosensitivity is thereby decreased, the dielectric withstand voltage is decreased and other problems are presented.

SUMMARY OF THE INVENTION

Since the present invention has been contrived in view of the above, its object is to provide a photoelectric transducer element wherein the switching speed is increased without degrading photosensitivity or decreasing the dielectric withstand voltage.

To achieve the above object of the invention, a photoelectric transducer element is provided, which comprises a semiconductor substrate of a first conductivity type, a light receiving region of a second conductivity type formed in said substrate, and a region of said first conductivity type formed in a surface layer of said light-receiving region.

BRIEF DESCRIPTION OF THE DRAWINGS

FIGS. 1 and 2 are, respectively, a plan view and a sectional view of a conventional phototransistor, in which FIG. 2 is a sectional view thereof, taken along line II—II of FIG. 1;

FIGS. 3 and 4 are, respectively, a plan view and a sectional view of another conventional phototransistor, in which FIG. 4 is a sectional view thereof, taken along line IV—IV of FIG. 3;

FIGS. 5 and 6 are, respectively, a plan view and a sectional view of a phototransistor according to a first embodiment of the present invention, in which FIG. 6 is a sectional view thereof, taken along line VI—VI of FIG. 5;

FIGS. 7 and 8 are, respectively, a plan view and a sectional view of a phototransistor according to a second embodiment of the present invention, in which FIG. 8 is a sectional view thereof taken along line VIII—VIII of FIG. 7;

FIGS. 10 and 11 are, respectively, a plan view and a sectional view of a phototransistor according to a third embodiment of the present invention, in which FIG. 11 is a sectional view thereof taken along line XI—XI of FIG. 10; and FIGS. 12 and 13 are, respectively, a plan view and a sectional view of a phototransistor according to a fourth embodiment of the present invention, in which FIG. 13 is a sectional view thereof taken along line XIII—XIII of FIG. 12.

DETAILED DESCRIPTION OF THE PREFERRED EMBODIMENTS

Figure 5:
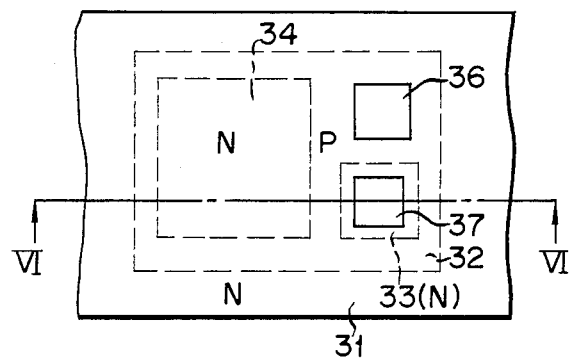
Figure 6:
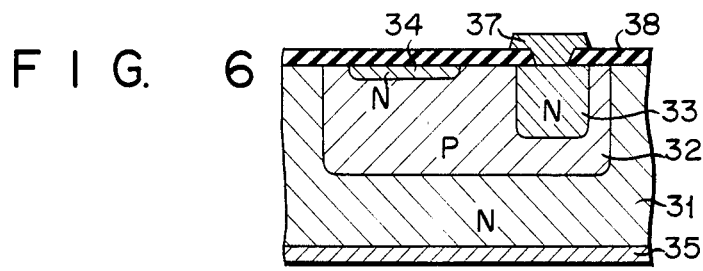

FIGS. 5 and 6 are, respectively, a plan view and a sectional view of a phototransistor according to a first embodiment of the present invention.

A p conductivity type diffusion region 32 serving as a light-receiving region (i.e., base region) is formed in an N conductivity type silicon substrate 31. This P-type base region 32 has a depth of 4 $\mu$m and a width of 450 $\mu$m. An impurity concentration in the P-type base region 32 falls within the range of between $1 \times 10^{11}$ cm$^{-3}$ and $2 \times 10^{13}$ cm$^{-3}$. An N conductivity type diffusion region 33 is formed in the P-type base region 32. This N-type diffusion region 33 has a width of 200 $\mu$m and serves as an emitter region. An impurity concentration of the N-type emitter region 33 is about $10^{20}$ cm$^{-3}$. An area of the P-type base region 32 is twice or more that of the N-type emitter region 33. A diffusion region 34 of a conductivity type (i.e., N conductivity type) different from that of the P-type base region 32 is formed in part of a surface layer of the P-type base region 32 which excludes the N-type emitter region 33. The potential of the N-type region 34 is floating. An impurity concentration of the N-type diffusion region 34 can be equal to or lower than that of the N-type emitter region 33 and higher than that of the P-type base region 32. Even if the impurity concentration of N-type diffusion region 34 is considerably lower than that of the N-type emitter region 33, the switching speed of the phototransistor can be improved.

A collector electrode 35, a base electrode 36 and an emitter electrode 37, which are made of gold or aluminum, are formed on the substrate 31, the base region 32 and the emitter region 33, respectively. Reference numeral 38 denotes an SiO$_2$ (silicon dioxide) film.

In the phototransistor having the structure described above, since the N-type region 34 of the conductivity type opposite to that of the P-type base region 32 is formed in the surface layer of the P-type base region 32, carriers generated at the time of light reception can be absorbed in the N-type region 34 when light is shielded. Therefore, the turn-off time can be shortened and the switching speed is improved. However, the area of the base region 32 and the resistivity of the silicon substrate 31 are the same as those of the conventional phototransistor. As a result, neither photosensitivity nor a dielectric withstand voltage will be decreased.

Figure 7:
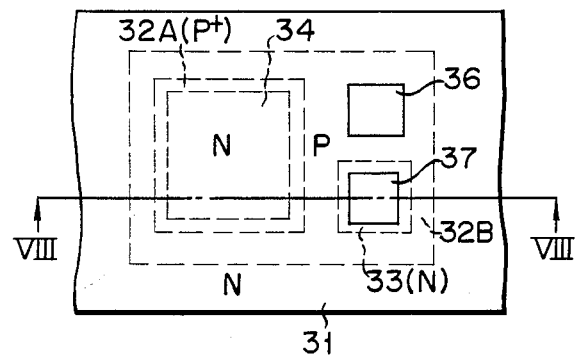
Figure 8:
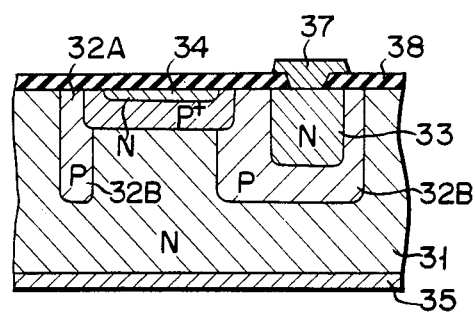

FIGS. 7 and 8 are, respectively, a plan view and a sectional view of a phototransistor according to a second embodiment of the present invention. The same reference numerals used in the first embodiment (FIGS. 5 and 6) denote the same parts in the second embodiment.

In the second embodiment, two p conductivity type diffusion regions 32A, 32B comprising a base region serving as a light-receiving region are continuously formed in an N conductivity type silicon substrate 31. More specifically, the base region has a P$^+$-type region 32A and a P-type peripheral region 32B. Region 32A is shallower than region 32B, but has a higher impurity concentration than region 32B. An N conductivity type emitter diffusion region 33 is formed in the P-type region 32B. An N-type diffusion region 34 of the conductivity type opposite to that of the P$^+$-type region 32A is formed in part of a surface layer of the P$^+$-type region 32A. The impurity concentration of the N-type region 34 can be equal to or lower than that of the emitter region 33. The potential of the N-type region 34 is floating. The entire area of the base region having regions 32A and 32B is twice or more that of the N-type emitter region 33.

A collector electrode 35, a base electrode 36 and an emitter electrode 37, which are made of gold or aluminum, are formed on the silicon substrate 31, the P-type base region 32B and the N-type emitter region 33, respectively. Reference numeral 38 denotes an SiO$_2$ film.

In the phototransistor shown in FIGS. 7 and 8, in the same manner as in the case of that shown in FIGS. 5 and 6, since the N-type region 34 of the conductivity type opposite to that of the P$^+$-type region 32A is formed in the surface layer of the P$^+$-type region 32A as the light-receiving region, carriers generated at the time of light reception can be absorbed in the N-type region 34 when light is shielded. Therefore, the turn-off time is shortened and the switching speed is improved. The area of the base region having regions 32A and 32B and the resistivity of the silicon substrate are substantially the same as those of the conventional phototransistor. Accordingly, neither the photosensitivity nor the dielectric withstand voltage will be decreased.

Figure 10:
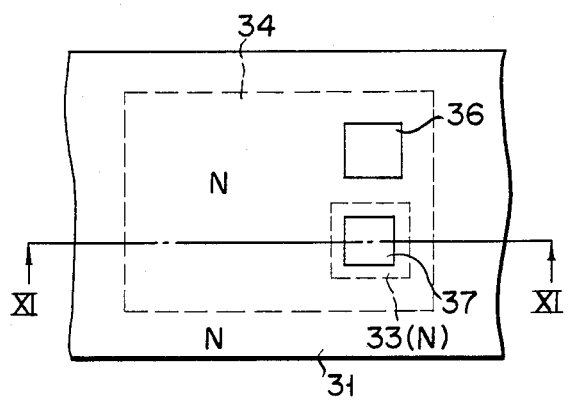
Figure 11:
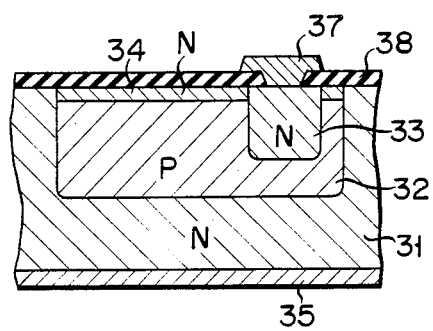
Figure 12:
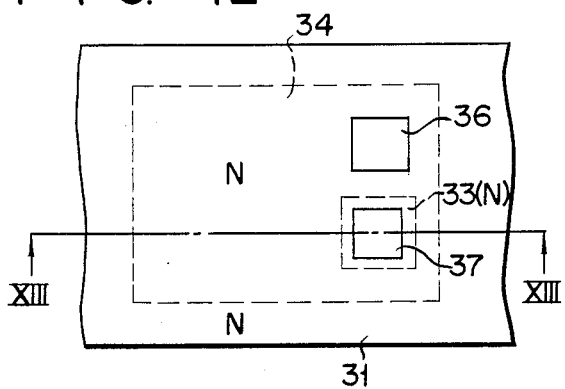
Figure 13:
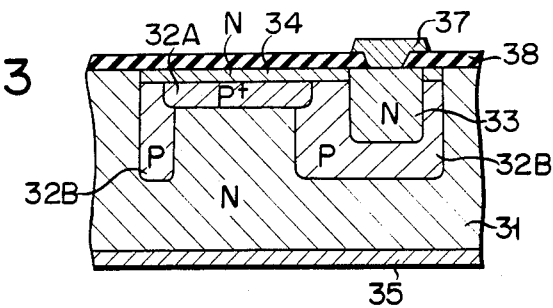

In each of the phototransistors shown in FIGS. 5 to 8, the N-type region 34 is formed on part of the surface layer of the light-receiving region. However, the N-type region 34 may be formed over the entire surface layer of the light-receiving region. In the phototransistor shown in FIGS. 5 and 6, the N-type region 34 can be formed to cover the entire area of the base region 32 excluding a portion at which the emitter region 33 is formed, as shown in FIGS. 10 and 11. Similarly, in the phototransistor shown in FIGS. 7 and 8, the N-type region 34 can be formed to cover the entire area of the base regions 32A and 32B excluding only a portion of the P$^+$-type region 32B at which the N-type region 33 is formed. In each of the phototransistors shown in FIGS. 10 to 13, since the N-type region 34 is formed to cover the entire surface layer of the light-receiving region, the carrier absorption capacity of the N-type region 34 is improved. As a result, the turn-off time is further shortened.

Figure 1:
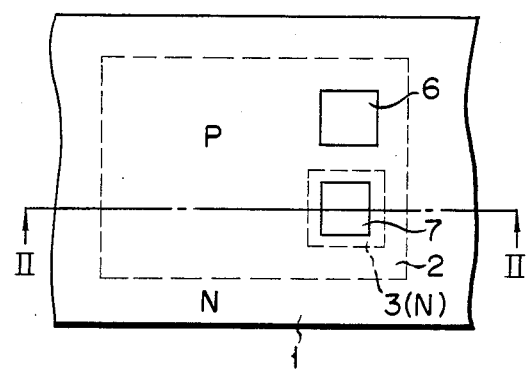
Figure 2:
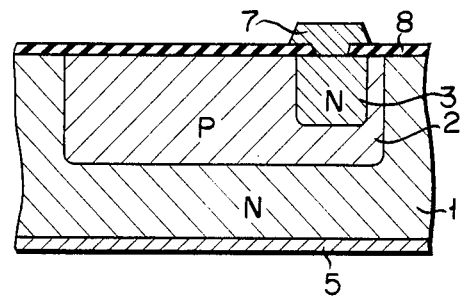
Figure 3:
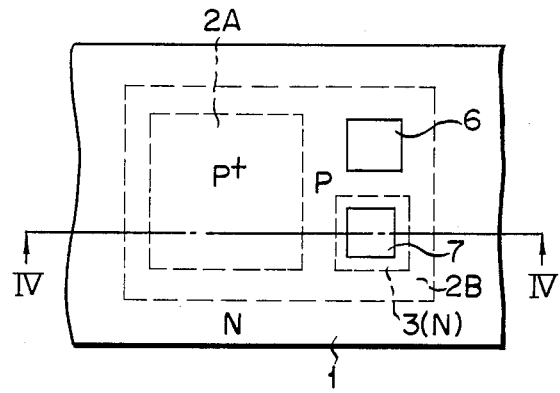
Figure 4:
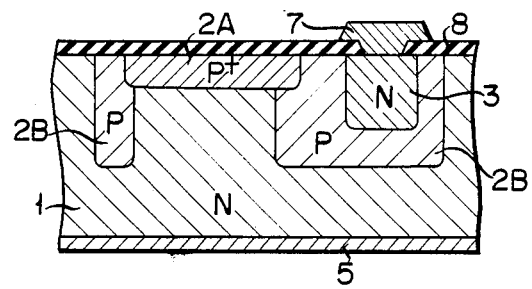
Figure 9:
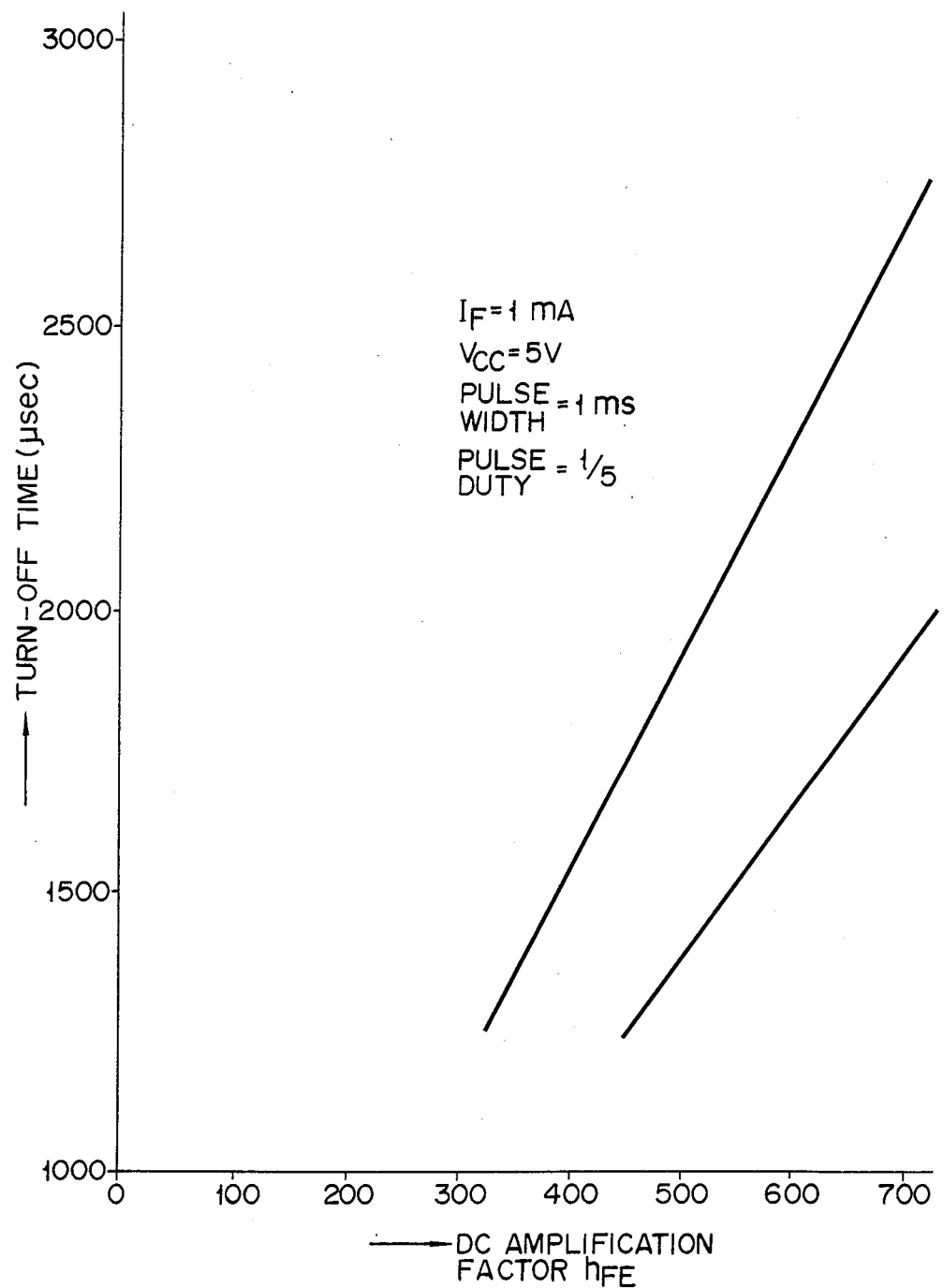
FIG. 9 is a graph showing the turn-off time characteristics of a conventional phototransistor and the phototransistor shown in FIGS. 5 and 6.

FIG. 9 is a graph showing the turn-off characteristics of the conventional phototransistor shown in FIGS. 1 and 2, as well as of the phototransistor shown in FIGS. 5 and 6. The DC amplification factor $h_{fe}$ is plotted along the axis of abscissa, and the turn-off time ($\mu$sec) is plotted along the axis of ordinate. The reverse bias voltage Vcc between the collector and the base was 5 V, the current $I_F$ between the collector and the base was 1 mA, the pulse applied to the base had a pulse width of 1 ms, and the pulse duty was 1/5. As shown in FIG. 9, the turn-off time of the phototransistor of the present invention is greatly shortened, as compared to that of the conventional phototransistor. It was found that the switching speed of the transistor of the present invention is greatly improved. The area of the base region as the light-receiving region and the resistivity of the substrate are the same as those of the conventional phototransistor. Thus, neither the photosensitivity nor the dielectric withstand voltage will be decreased.

In the above embodiments, the base region 32 (having regions 32A and 32B) can be formed by thermally diffusing a P-type impurity such as boron. The N-type emitter region 33 can be formed by thermally diffusing an N-type impurity such as phosphorus. N-type region 34 can be formed simultaneously when N-type emitter region 33 is formed by thermal diffusion. In this case, to preset the impurity concentration of the N-type region 34 at a level lower than that of the N-type emitter region 33, thermal diffusion can be performed through a thin oxide film, such as a silicon oxide film. This process simplifies the manufacturing steps.

The collector electrode 35, the base electrode 36 and the emitter electrode 37 can be obtained by depositing gold or aluminum.

In the above embodiments, the N-type region 34 is formed by thermal diffusion. However, ion-implantation or deposition may be used in place of thermal diffusion. Furthermore, in the above embodiments, the silicon substrate is of the N conductivity type. However, a P-type silicon substrate may also be used. In this case, the conductivity types of the regions formed in the substrate must be reversed. In addition to the above modifications, the substrate need not be formed of silicon, since any other semiconductor material may be used to form the substrate.

In the above embodiments, the present invention is applied to the phototransistor. However, the present invention is not limited in application to this type of element, since it can also be applied to various other photoelectric transducer elements, such as a photodiode, to obtain the same effect.

According to the present invention, as described above, since the region of a conductivity type opposite to that of the light-receiving region is formed in the surface layer of the light-receiving region, carriers generated upon light reception can be absorbed in the region of the conductivity type opposite to that of the light-receiving region at the time of light shielding. As a result, a photoelectric transducer element having an improved switching speed can be provided.

What is claimed is:

1. A phototransistor comprising:
    a semiconductor substrate of a first conductivity type constituting a collector region:
    a base region of a second conductivity type formed in said semiconductor substrate and having a surface area, said base region constituting a light receiving region;
    an emitter region of said first conductivity type formed in said base region and having a surface area;
    a floating potential region of said first conductivity type formed in the surface layer of said base region;
    a collector electrode provided on said semiconductor substrate constituting a collector region;
    a base electrode provided on said base region; and
    an emitter electrode provided on said emitter region.

2. A phototransistor according to claim 1, wherein said surface area of said base region is at least twice as large as said surface area of said emitter region.

3. A phototransistor according to claim 1, wherein said floating potential region is formed in part of said base region.

4. A phototransistor according to claim 1, wherein said floating potential region is formed over the entire region of said base region.

5. A phototransistor according to claim 1, wherein said floating potential region contacts said base region.